(12) United States Patent
Bao et al.

(10) Patent No.: US 10,395,989 B2
(45) Date of Patent: Aug. 27, 2019

(54) MULTI-LAYER WORK FUNCTION METAL GATES WITH SIMILAR GATE THICKNESS TO ACHIEVE MULTI-VT FOR VFETS

(71) Applicant: INTERNATIONAL BUSINESS MACHINES CORPORATION, Armonk, NY (US)

(72) Inventors: Ruqiang Bao, Niskayuna, NY (US); Hemanth Jagannathan, Niskayuna, NY (US); Paul C. Jamison, Poestenkill, NY (US); ChoongHyun Lee, Rensselaer, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/788,469

(22) Filed: Oct. 19, 2017

(65) Prior Publication Data
US 2018/0294191 A1    Oct. 11, 2018

Related U.S. Application Data

(62) Division of application No. 15/481,012, filed on Apr. 6, 2017, now Pat. No. 10,002,791.

(51) Int. Cl.
| | |
|---|---|
| *H01L 27/088* | (2006.01) |
| *H01L 21/8234* | (2006.01) |
| *H01L 27/092* | (2006.01) |
| *H01L 21/8238* | (2006.01) |
| *H01L 29/78* | (2006.01) |

(Continued)

(52) U.S. Cl.
CPC ......... *H01L 21/82345* (2013.01); *H01L 21/823487* (2013.01); *H01L 21/823821* (2013.01); *H01L 21/823842* (2013.01); *H01L 21/823885* (2013.01); *H01L 27/088* (2013.01); *H01L 27/092* (2013.01); *H01L 27/0924* (2013.01); *H01L 29/785* (2013.01); *H01L 29/4958* (2013.01); *H01L 29/4966* (2013.01); *H01L 29/66545* (2013.01)

(58) Field of Classification Search
CPC .................. H01L 27/088; H01L 27/092
See application file for complete search history.

(56) References Cited

U.S. PATENT DOCUMENTS

| | | |
|---|---|---|
| 8,659,077 B1 | 2/2014 | Ando et al. |
| 8,878,298 B2 | 11/2014 | Chang et al. |

(Continued)

OTHER PUBLICATIONS

List of IBM Patents or Patent Applications Treated as Related dated Oct. 19, 2017, 2 pages.

(Continued)

*Primary Examiner* — Trang Q Tran
(74) *Attorney, Agent, or Firm* — Tutunjian & Bittetto, P.C.; Vazken Alexanian

(57) ABSTRACT

A method is presented for forming a device having multiple field effect transistors (FETs) with each FET having a different work function. In particular, the method includes forming multiple microchips in which each FET has a different threshold voltage (Vt) or work-function. In one embodiment, four FETs are formed over a semiconductor substrate. Each FET has a source, drain and a gate electrode. Each gate electrode is processed independently to provide a substantially different threshold voltage.

20 Claims, 15 Drawing Sheets

(51) Int. Cl.
  *H01L 29/49* (2006.01)
  *H01L 29/66* (2006.01)

(56) References Cited

U.S. PATENT DOCUMENTS

| | | |
|---|---|---|
| 9,012,319 B1 | 4/2015 | Choi et al. |
| 9,397,199 B1 | 7/2016 | Kwon et al. |
| 9,406,679 B2 | 8/2016 | Edge et al. |
| 9,972,623 B1 | 5/2018 | Lin et al. |
| 2014/0070307 A1 | 3/2014 | Ando et al. |
| 2015/0262828 A1 | 9/2015 | Brand et al. |
| 2016/0020154 A1 | 1/2016 | Cheng et al. |
| 2016/0093535 A1 | 3/2016 | Xu et al. |
| 2017/0213826 A1* | 7/2017 | Kim .................. H01L 27/088 |
| 2018/0053821 A1 | 2/2018 | Mallela et al. |

OTHER PUBLICATIONS

Cho et al., "Si FinFET based 10nm Technology with Multi Vt Gate Stack for Low Power and High Performance Applications", 2016 Symposium on VLSI Technology Digest of Technical Papers. Jun. 14-16, 2016. pp. 12-13.

Notice of Allowance with cited art in corresponding U.S. Appl. No. 15/958,765 dated Jan. 24, 2019.

* cited by examiner

MULTI-LAYER WORK FUNCTION METAL GATES WITH SIMILAR GATE THICKNESS TO ACHIEVE MULTI-VT FOR VFETS

BACKGROUND

Technical Field

The present invention relates generally to semiconductor devices, and more specifically, to multi-layer work function metal gates with similar gate thickness to achieve different threshold voltages for each field effect transistor (FET).

Description of the Related Art

There is great difficulty in maintaining performance improvements in devices of deep submicron generations. Thus, methods for improving performance without scaling down dimensions have become of interest. There is a promising avenue toward higher gate capacitance without having to make the gate dielectric thinner. This approach involves the use of high-k materials. The dielectric constant of such materials is higher than that of silicon dioxide ($SiO_2$). A high-k material can physically be thicker than an oxide and still have a lower equivalent oxide thickness (EOT) value.

High performance small field effect transistor (FET) devices are in need of precise threshold voltage control. As operating voltage decreases, threshold voltages also have to decrease, and threshold variation becomes less tolerable. Every new element, such as a different gate dielectric, or a different gate material, influences the threshold voltage. Techniques exist to tune device thresholds through the modification of the gate work function.

SUMMARY

In accordance with an embodiment, a method is provided for forming a device having multiple field effect transistors (FETs) with each FET having a different work function gate stack. The method includes forming first, second, third, and fourth FETs over a semiconductor substrate, forming an interfacial layer and a high-k dielectric layer over the first, second, third, and fourth FETs, forming a first work function conducting layer over the high-k dielectric layer, and removing the first work function conducting layer from the third FET. The method further includes depositing a second work function conducting layer, removing the first and second work function conducting layers from the second FET, depositing a third work function conducting layer, removing the first, second, and third work function conducting layers from the first FET, and depositing a fourth work function conducting layer. The method further includes depositing a sacrificial block layer and a sacrificial cap layer, removing the sacrificial block layer and the sacrificial cap layer from the first and second FETs, depositing a fifth work function conducting layer and a patterning cap layer, removing the patterning cap layer, the fifth work function conducting layer, and the sacrificial cap layer from the third and fourth FETs, and removing the sacrificial block layer from the third and fourth FETs. The method further includes depositing first and second conducting layers over the first, second, third, and fourth FETs, depositing a dummy fill material, recessing the dummy fill material, recessing remaining work function conducting layers from the first, second, third, and fourth FETs to expose a hard mask of each of the first, second, third, and fourth FETs, and stripping the dummy fill material. The method further includes depositing a dielectric layer up to a top surface of the hard mask of each of the first, second, third, and fourth FETs, recessing the dielectric layer and forming spacers, performing isolation patterning of the first, second, third, and fourth FETs for isolation FETs, depositing an insulator between the recesses formed by the isolation patterning, and etching to expose a top portion of a channel of each of the first, second, third, and fourth FETs.

In accordance with another embodiment, a semiconductor device is provided for forming a device having multiple field effect transistors (FETs) with each FET having a different work function. The semiconductor device includes first, second, third, and fourth FETs formed over a semiconductor substrate, a high-k dielectric layer formed over the first, second, third, and fourth FETs, a first work function conducting layer formed over the high-k dielectric layer, where the first work function conducting layer is subsequently removed from the third FET, a second work function conducting layer, where the first and second work function conducting layers are subsequently removed from the second FET, a third work function conducting layer, where the first, second, and third work function conducting layers are subsequently removed from the first FET, and a fourth work function conducting layer. The structure further includes a sacrificial block layer and a sacrificial cap layer, the sacrificial block layer and the sacrificial cap layer subsequently removed from the first and second FETs, a fifth work function conducting layer and a patterning cap layer, where the patterning cap layer, the fifth work function conducting layer, the sacrificial cap, and the sacrificial block layer are subsequently removed from the third and fourth FETs, and first and second conducting layers formed over the first, second, third, and fourth FETs.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
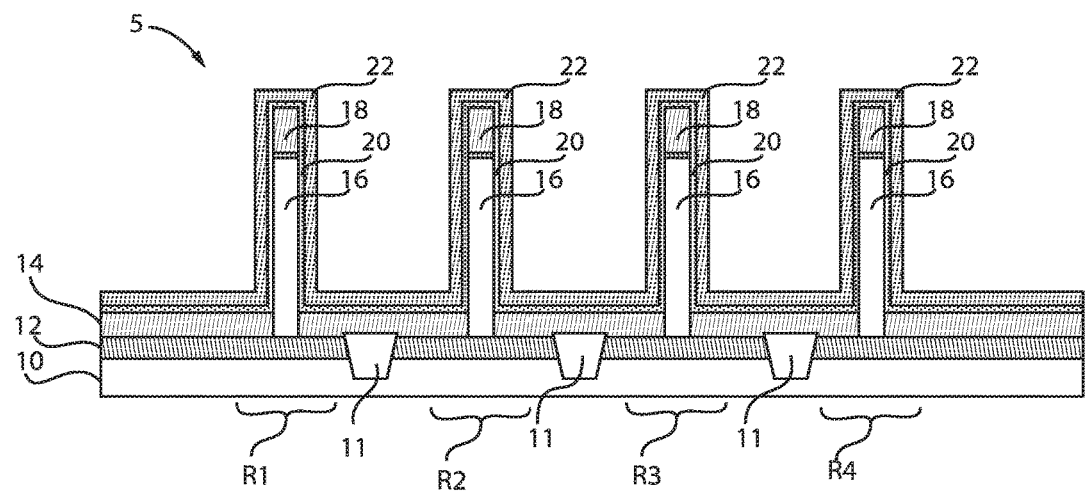
FIG. 1 is a cross-sectional view of a semiconductor structure including a first work function metal layer deposited over first, second, third, and fourth field effect transistors (FETs), in accordance with an embodiment of the present invention.

Embodiments in accordance with the present invention provide methods and devices for achieving multiple work functions on a single structure. Multiple work function gate stacks can be useful to achieve multiple threshold voltages on fully depleted channel architectures. A variety of different work-function setting metal stacks can be used. In one example, a structure including four FETs is used. Each FET can be designed to have a different threshold voltage. Multiple pure metal gates can be formed and similar gate thickness can be used to achieve a multi-Vt structure for FETs. The FETs can be, e.g., vertical FETs. The multi-layer gate stacks can define the voltage thresholds with different metal layers among the voltage thresholds. Moreover, there can be some common layers to connect the FETs. However, the work functions need not be shared between all the FETs. The thickness difference between the gate stacks of the FETs can be, e.g., less than about 3 nm, which can be fined-tuned to be even smaller. Thus, a similar gate stack thickness can be achieved for each Vt structure.

Examples of semiconductor materials that can be used in forming such multi-Vt structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

A "gate structure" means a structure used to control output current (i.e., flow of carriers in the channel) of a semiconducting device through electrical or magnetic fields.

As used herein, the term "drain" means a doped region in the semiconductor device located at the end of the channel, in which carriers are flowing out of the transistor through the drain.

As used herein, the term "source" is a doped region in the semiconductor device, in which majority carriers are flowing into the channel.

The term "direct contact" or "directly on" means that a first element, such as a first structure, and a second element, such as a second structure, are connected without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure can be present between the first element and the second element.

The term "electrically connected" means either directly electrically connected, or indirectly electrically connected, such that intervening elements are present; in an indirect electrical connection, the intervening elements can include inductors and/or transformers.

The term "crystalline material" means any material that is single-crystalline, multi-crystalline, or polycrystalline.

The term "non-crystalline material" means any material that is not crystalline; including any material that is amorphous, nano-crystalline, or micro-crystalline.

The term "intrinsic material" means a semiconductor material which is substantially free of doping atoms, or in which the concentration of dopant atoms is less than $10^{15}$ atoms/cm$^3$.

As used herein, the terms "insulating" and "dielectric" denote a material having a room temperature conductivity of less than about $10^{-10}$ $(\Omega\text{-m})^{-1}$.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

The terms, chip, integrated circuit, monolithic device, semiconductor device, and microelectronic device, are often used interchangeably in this field. The present invention is applicable to all the above as they are generally understood in the field.

The terms metal line, interconnect line, trace, wire, conductor, signal path and signaling medium are all related. The related terms listed above, are generally interchangeable, and appear in order from specific to general. In this field, metal lines are sometimes referred to as traces, wires, lines, interconnect or simply metal. Metal lines, generally aluminum (Al), copper (Cu) or an alloy of Al and Cu, are conductors that provide signal paths for coupling or interconnecting electrical circuitry. Conductors other than metal are available in microelectronic devices. Materials such as doped polysilicon, doped single-crystal silicon (often referred to simply as diffusion, regardless of whether such doping is achieved by thermal diffusion or ion implantation), titanium (Ti), molybdenum (Mo), and refractory metal silicides are examples of other conductors.

The terms contact and via, both refer to structures for electrical connection of conductors from different interconnect levels. These terms are sometimes used in the art to describe both an opening in an insulator in which the structure will be completed, and the completed structure itself. For purposes of this invention contact and via refer to the completed structure.

As used herein, an "anisotropic etch process" denotes a material removal process in which the etch rate in the direction normal to the surface to be etched is greater than in the direction parallel to the surface to be etched. The anisotropic etch can include reactive-ion etching (RIE).

Reactive ion etching (RIE) is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used include ion beam etching, plasma etching or laser ablation.

The term "processing" as used herein includes deposition of material or photoresist, patterning, exposure, development, etching, cleaning, stripping, implanting, doping, stressing, layering, and/or removal of the material or photoresist as required in forming a described structure.

As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this invention.

The present subject matter will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIG. 1 is a cross-sectional view of a semiconductor structure including a first work function metal layer deposited over first, second, third, and fourth field effect transistors (FETs), in accordance with an embodiment of the present invention.

A semiconductor structure 5 includes a semiconductor substrate 10 with a fin structure 16 positioned thereon. The bottom contact 12 is deposited over the substrate 10. The contact 12 can be, e.g., early doped epi or highly doped Si substrate. An isolation layer (bottom spacer) 14 can be deposited over the bottom contact 12. STI regions 11 are further formed within the contact 12 and extending into the substrate 10. In one embodiment, a proximal portion of the fin 16 extends into the isolation dielectric layer 14. The fin 16 extend vertically from the substrate 10. Stated differently, the fin 16 is normal to or perpendicular to the substrate 10.

A high k dielectric oxide layer 20 is deposited over the fins 16, as well as over the bottom junction 12. The high k dielectric oxide layer 20 encompasses or envelops the fins 16. Additionally, a hard mask 18 can be deposited or formed over each of the fins 16. The hard mask 18 can be a nitride hard mask or an oxide hard mask. The hard mask 18 is also enveloped by the nitride and oxide hard mask. The hard mask 18 is aligned with the fin structure 16.

In one or more embodiments, the substrate 10 can be a semiconductor or an insulator with an active surface semiconductor layer. The substrate 10 can be crystalline, semi-crystalline, microcrystalline, or amorphous. The substrate 10 can be essentially (i.e., except for contaminants) a single element (e.g., silicon), primarily (i.e., with doping) of a single element, for example, silicon (Si) or germanium (Ge), or the substrate 10 can include a compound, for example, $Al_2O_3$, $SiO_2$, GaAs, SiC, or SiGe. The substrate 10 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 10 can also have other layers forming the substrate 10, including high-k oxides and/or nitrides. In one or more embodiments, the substrate 10 can be a silicon wafer. In an embodiment, the substrate 10 is a single crystal silicon wafer.

In one or more embodiments, a first work function conducting layer 22 is deposited over the high k dielectric oxide layer 20. The first work function conducting layer 22 can be, e.g., a first work function metal layer 22. The first work function metal layer 22 can be, e.g., titanium nitride (TiN). The thickness of the first work function metal layer 22 can be about 1 nm to about 4 nm. The thickness of the first work function metal layer 22 can be greater than the thickness of the high k dielectric oxide layer 20. The first work function metal layer 22 is deposited over each of the fins 16. The example embodiment illustrates four fins 16. Of course, one skilled in the art can contemplate a plurality of fins 16 forming structure 5.

The first fin 16 can be defined in a first region R1, the second fin 16 can be defined in a second region R2, the third fin 16 can be defined in a third region R3, and the fourth fin 16 can be defined in a fourth region R4. The fin of the first region R1 can define an nFET, and in particular, a super low Vt (SLVT) nFET. The fin of the second region R2 can define an nFET, and in particular, a regular Vt (RVT) nFET. The fin of the third region R3 can define a pFET, and in particular, a regular Vt (RVT) pFET. The fin of the fourth region R4 can define a pFET, and in particular, a super low Vt (SLVT) pFET.

The "work function" (WF) is the minimum energy (usually measured in electron volts) needed to remove an electron from a solid to a point immediately outside the solid surface (or energy needed to move an electron from the Fermi energy level into vacuum). Here "immediately" means that the final electron position is far from the surface on the atomic scale but still close to the solid on the macroscopic scale. The work function is an important property of metals. The magnitude of the work function is usually about a half of the ionization energy of a free atom of the metal.

WF is a material property of any material, whether the material is a conductor, semiconductor, or dielectric. For a metal, the Fermi level lies within the conduction band, indicating that the band is partly filled. For an insulator, the Fermi level lies within the band gap, indicating an empty conduction band; in the case, the minimum energy to remove an electron is about the sum of half the band gap and the electron affinity. An effective work function (eWF) is defined as the WF of metal on the dielectric side of a metal-dielectric interface.

The WF of a semiconductor material can be altered by doping the semiconductor material. For example, undoped polysilicon has a work function of about 4.65 eV, whereas polysilicon doped with boron has a work function of about 5.15 eV. When used as a gate electrode, the WF of a semiconductor or conductor directly affects the threshold voltage of the transistor.

The WF is a key parameter for setting the threshold voltage (Vth) of the complementary metal oxide semiconductor (CMOS) device, whether an n-type field effect transistor (FET) or a p-type FET. In order to obtain a good electrical control of the FET devices, the WF value should be close to the valence band of the semiconductor for a pFET and close to the conduction band of the semiconductor for an nFET, and more particularly, about 5.2 eV and about 4.0 eV, respectively for the pFET and nFET in the case of silicon.

Such WF setting metal layers can include, for example, optional layers of about 10 Å to about 30 Å thick titanium nitride and about 10 Å to about 30 Å thick tantalum nitride, followed by a non-optional about 10 Å to about 40 Å thick layer of titanium aluminum, which together make up a WF setting metal layer portion of the metal gate material stack. Alternatively, titanium aluminum nitride, titanium aluminum carbide, tantalum aluminum, tantalum aluminum nitride, tantalum aluminum carbide, hafnium silicon alloy, hafnium nitride, or tantalum carbide can be used in the WF setting metal layer portion in lieu of the titanium aluminum.

Regardless of the specific WF setting metal layers used in either an nFET or a pFET device, the remainder of the metal gate material stack can include a fill metal such as aluminum, titanium-doped aluminum, tungsten or copper to result in the metal gate material stack.

ALD is a gas phase chemical process used to create extremely thin coatings. The majority of ALD reactions use two chemicals, typically called precursors. These precursors react with a surface one-at-a-time in a sequential manner. By exposing the precursors to the growth surface repeatedly, a thin film is deposited. ALD is a self-limiting, sequential surface chemistry that deposits conformal thin-films of materials onto substrates of varying compositions. ALD is similar in chemistry to chemical vapor deposition (CVD), except that the ALD reaction breaks the CVD reaction into two half-reactions, keeping the precursor materials separate during the reaction. ALD film growth is self-limited and based on surface reactions, which makes achieving atomic scale deposition control possible. By keeping the precursors separate throughout the coating process, atomic layer control of film grown can be obtained as fine as ~0.1 angstroms per monolayer. ALD has unique advantages over other thin film deposition techniques, as ALD grown films are conformal, pin-hole free, and chemically bonded to the substrate.

With ALD it is possible to deposit coatings perfectly uniform in thickness inside deep trenches, porous media and around particles. The film thickness range is usually about 1-500 nm. ALD can be used to deposit several types of thin films, including various ceramics, from conductors to insulators.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In various embodiments, formation of a layer can be by one or more deposition processes, where, for example, a conformal layer can be formed by a first process (e.g., ALD, PE-ALD, etc.) and a fill can be formed by a second process (e.g., CVD, electrodeposition, PVD, etc.).

Figure 2:
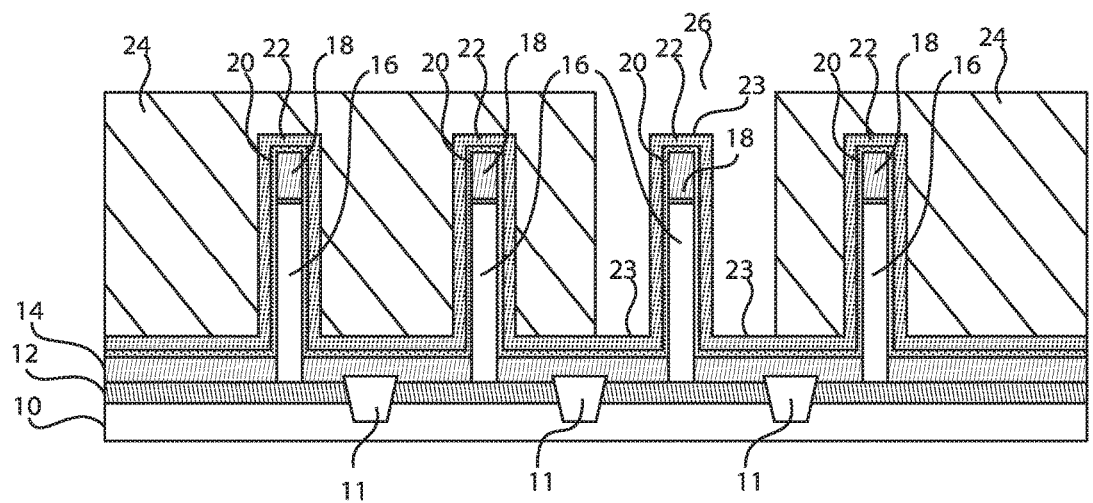
FIG. 2 is a cross-sectional view of the semiconductor structure of FIG. 1 where a patterning block layer (or stack) is deposited and recessed around the third FET, in accordance with an embodiment of the present invention.

FIG. 2 is a cross-sectional view of the semiconductor structure of FIG. 1 where a patterning block layer (or stack) is deposited and recessed around the third FET, in accordance with an embodiment of the present invention.

In various example embodiments, a patterning block layer (or stack) 24 is deposited over the fins 16. A portion of the patterning block layer (or stack) 24 is removed to create a recess 26 in an area surrounding the third fin 16. The removal of the portion of the patterning block layer (or stack) 24 results in a top surface 23 of the first work function metal layer 22 being exposed.

Figure 3:
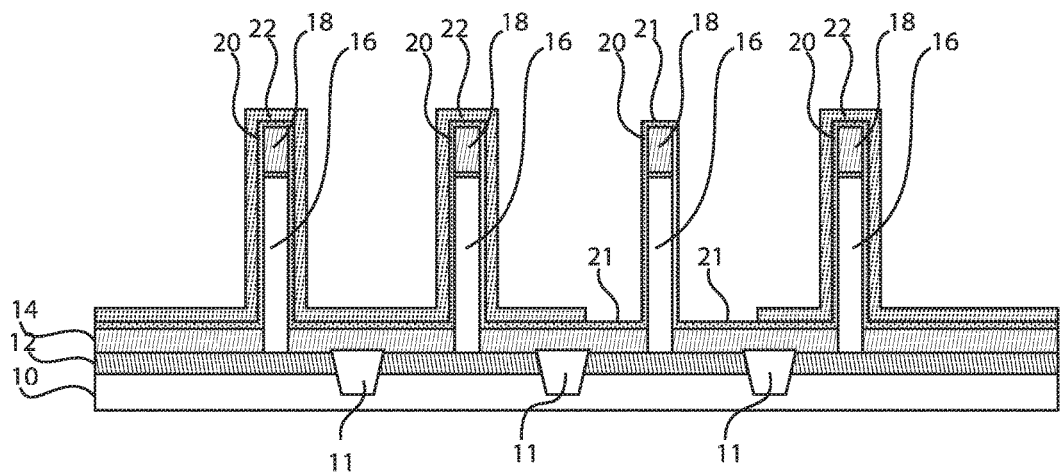
FIG. 3 is a cross-sectional view of the semiconductor structure of FIG. 2 where the first work function metal layer is removed from the third FET, in accordance with an embodiment of the present invention.

FIG. 3 is a cross-sectional view of the semiconductor structure of FIG. 2 where the first work function metal layer is removed from the third FET, in accordance with an embodiment of the present invention.

In various example embodiments, the first work function metal layer 22 is selectively etched or removed from the third fin 16 (pFET RVT). Removal of the first work function metal layer 22 results in a top surface 21 of the high k dielectric oxide layer 20 being exposed in the third region R3. Moreover, the first, second, and fourth FETs (nFET SLVT, nFET RVT, and pFET SLVT) have a shared or common layer, that is, a first work function metal layer 22.

The etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist. The patterned photoresist can be removed utilizing an ashing process.

As used herein, the term "selective" in reference to a material removal process denotes that the rate of material removal for a first material is greater than the rate of removal for at least another material of the structure to which the material removal process is being applied. For example, in one embodiment, a selective etch can include an etch chemistry that removes a first material selectively to a second material by a ratio of 10:1 or greater, e.g., 100:1 or greater, or 1000:1 or greater.

Figure 4:
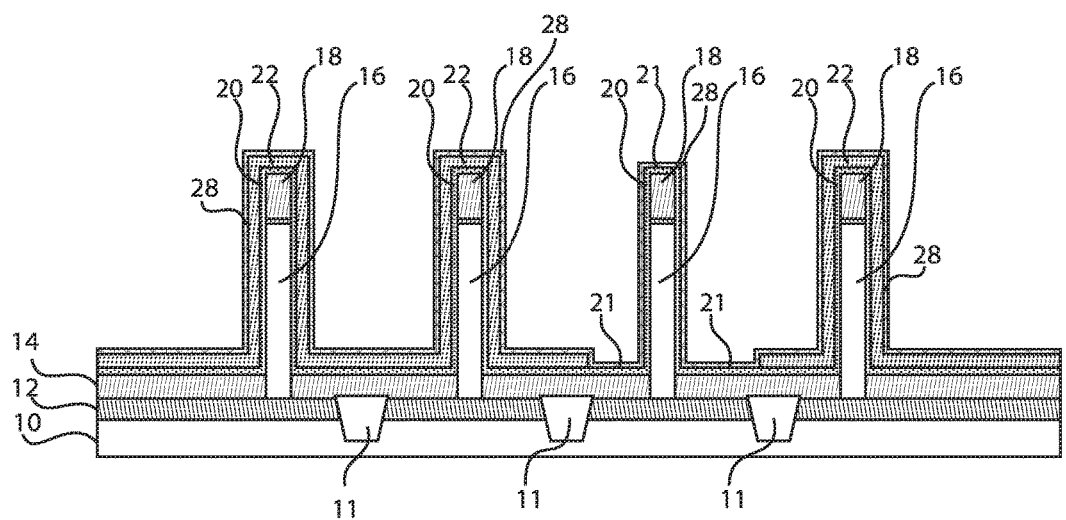
FIG. 4 is a cross-sectional view of the semiconductor structure of FIG. 3 where a second work function metal layer is deposited, in accordance with an embodiment of the present invention.

FIG. 4 is a cross-sectional view of the semiconductor structure of FIG. 3 where a second work function metal layer is deposited, in accordance with an embodiment of the present invention.

In various example embodiments, a second work function conducting layer 28 is deposited. The second work function conducting layer 28 can be, e.g., a second work function metal layer 28. The second work function metal layer 28 can be, e.g., titanium nitride (TiN). The thickness of the second work function metal layer 28 can be about 0.5 nm to about 2 nm. The second work function metal layer 28 is deposited over each of the fins 16.

Figure 5:
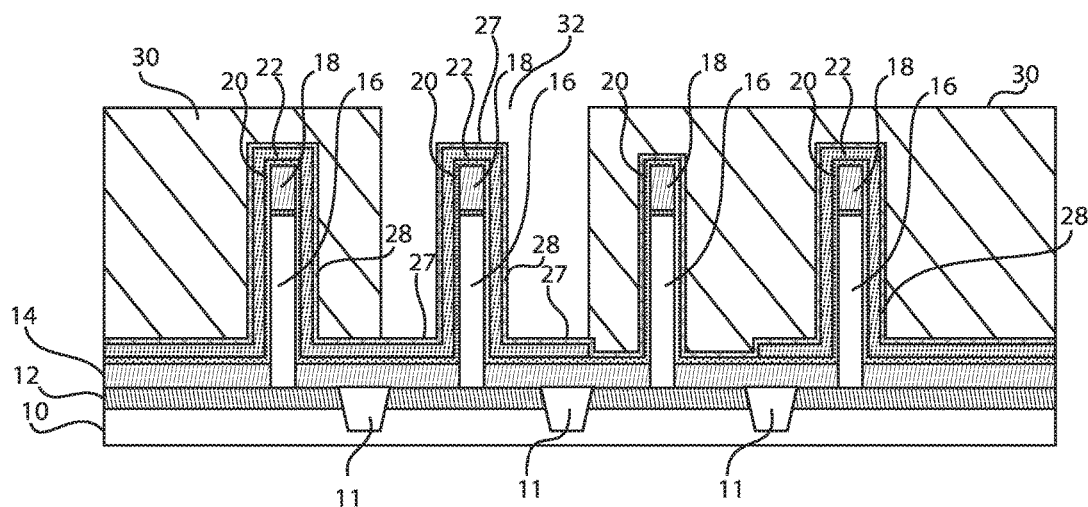
FIG. 5 is a cross-sectional view of the semiconductor structure of FIG. 4 where a patterning block layer (or stack) is deposited and recessed around the second FET, in accordance with an embodiment of the present invention.

FIG. 5 is a cross-sectional view of the semiconductor structure of FIG. 4 where a patterning block layer (or stack) is deposited and recessed around the second FET, in accordance with an embodiment of the present invention.

In various example embodiments, a patterning block layer (or stack) 30 is deposited over the fins 16. A portion of the patterning block layer (or stack) 30 is removed to create a recess 32 in an area surrounding the second fin 16. The removal of the portion of the patterning block layer (or stack) 30 results in a top surface 27 of the second work function metal layer 28 being exposed.

Figure 6:
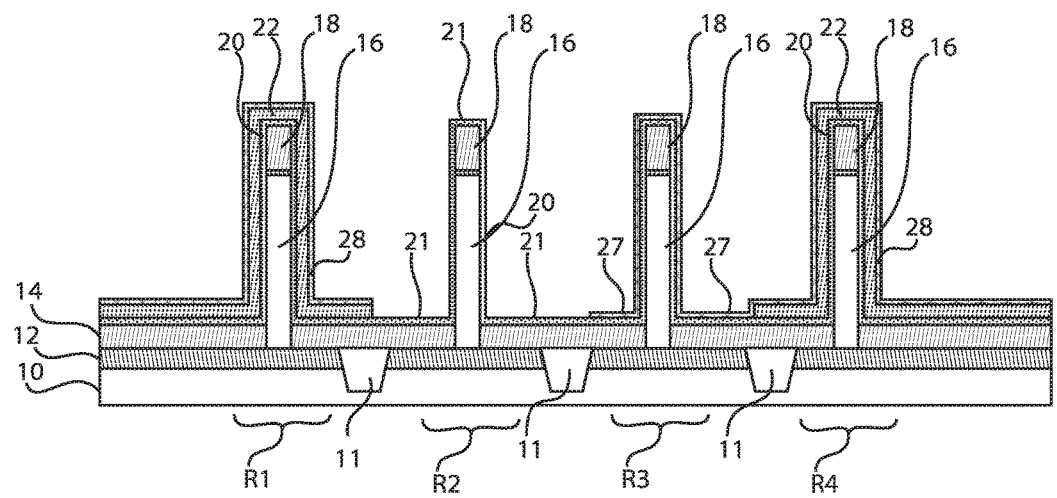
FIG. 6 is a cross-sectional view of the semiconductor structure of FIG. 5 where the first and second work function metal layers are removed from the second FET, in accordance with an embodiment of the present invention.

FIG. 6 is a cross-sectional view of the semiconductor structure of FIG. 5 where the first and second work function metal layers are removed from the second FET, in accordance with an embodiment of the present invention.

In various example embodiments, the first and second work function metal layers 22, 28 are selectively etched or removed from the second fin 16 (nFET RVT). Removal of the first and second work function metal layers 22, 28 results in a top surface 21 of the high k dielectric oxide layer 20 being exposed in the second region R2. Moreover, the first, third, and fourth FETs (nFET SLVT, pFET RVT, and pFET SLVT) have a shared or common layer, that is, a second work function metal layer 28.

Figure 7:
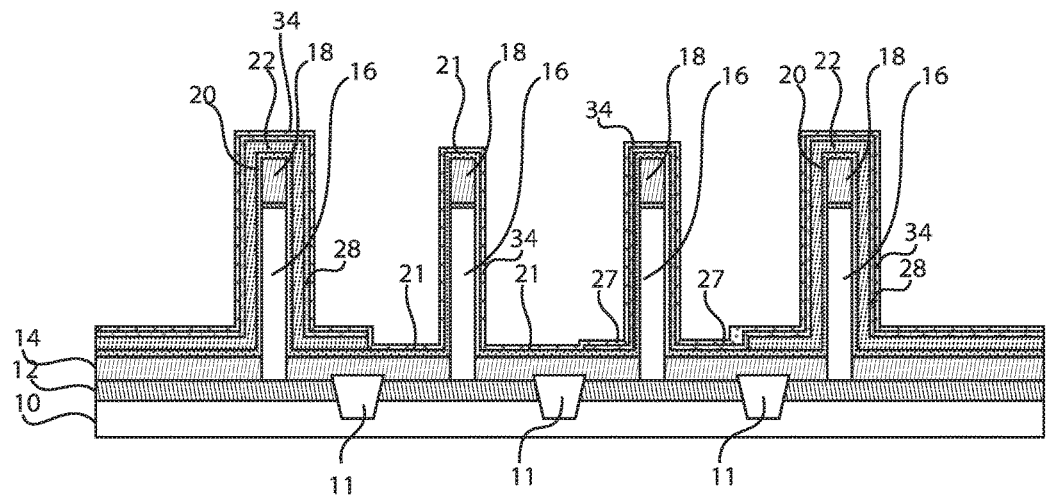
FIG. 7 is a cross-sectional view of the semiconductor structure of FIG. 6 where a third work function metal layer is deposited, in accordance with an embodiment of the present invention.

FIG. 7 is a cross-sectional view of the semiconductor structure of FIG. 6 where a third work function metal layer is deposited, in accordance with an embodiment of the present invention.

In various example embodiments, a third work function conducting layer 34 is deposited. The third work function conducting layer 34 can be, e.g., a third work function metal layer 34. The third work function metal layer 34 can be, e.g., titanium nitride (TiN). The thickness of the third work function metal layer 34 can be about 0.5 nm to about 1 nm. The third work function metal layer 34 is deposited over each of the fins 16.

Figure 8:
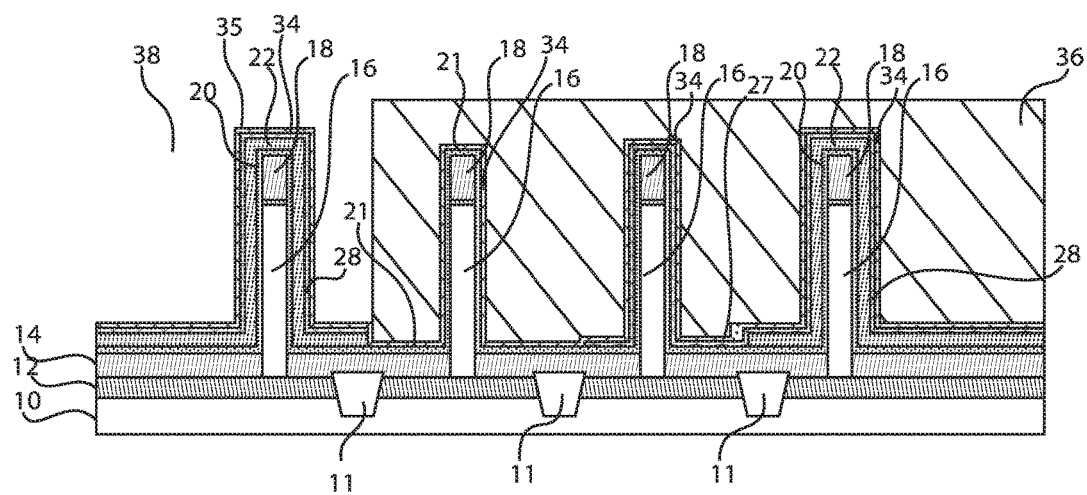
FIG. 8 is a cross-sectional view of the semiconductor structure of FIG. 7 where a patterning block layer (or stack) is deposited and recessed around the first FET, in accordance with an embodiment of the present invention.

FIG. 8 is a cross-sectional view of the semiconductor structure of FIG. 7 where a patterning block layer (or stack) is deposited and recessed around the first FET, in accordance with an embodiment of the present invention.

In various example embodiments, a patterning block layer (or stack) 36 is deposited over the fins 16. A portion of the oxide layer 36 is removed to create a recess 38 in an area surrounding the first fin 16. The removal of the portion of the oxide layer 36 results in a top surface 35 of the third work function metal layer 34 being exposed.

Figure 9:
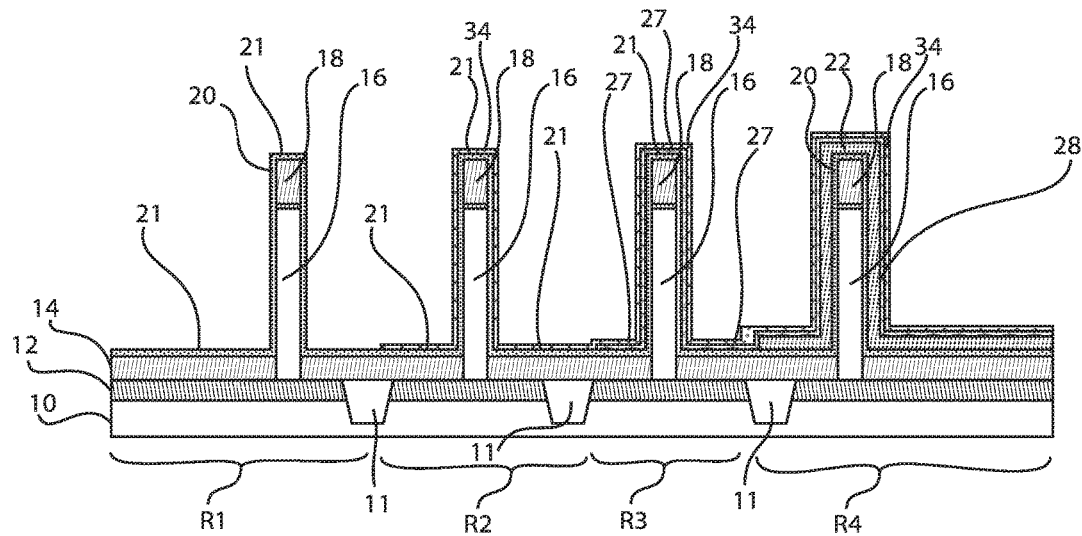
FIG. 9 is a cross-sectional view of the semiconductor structure of FIG. 8 where the first, second, and third work function metal layers are removed from the first FET, in accordance with an embodiment of the present invention.

FIG. 9 is a cross-sectional view of the semiconductor structure of FIG. 8 where the first, second, and third work function metal layers are removed from the first FET, in accordance with an embodiment of the present invention.

In various example embodiments, the first, second, and third work function metal layers 22, 28, 34 are selectively etched or removed from the first fin 16 (nFET SLVT). Removal of the first, second, and third work function metal layers 22, 28, 34 results in a top surface 21 of the high k dielectric oxide layer 20 being exposed in the first region R1. Moreover, the second, third, and fourth FETs (nFET RVT, pFET RVT, and pFET SLVT) have a shared or common layer, that is, a third work function metal layer 34.

Figure 10:
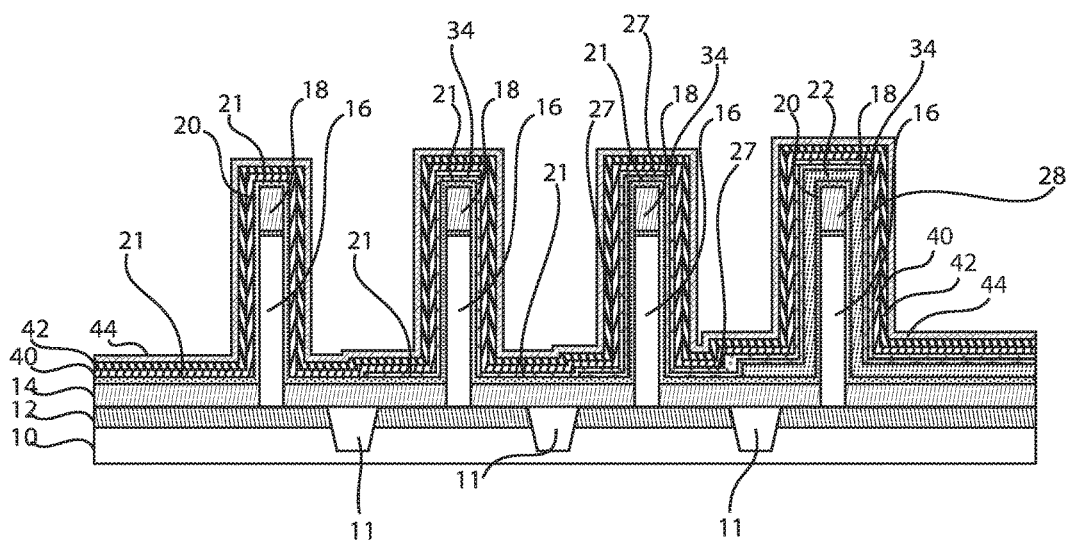
FIG. 10 is a cross-sectional view of the semiconductor structure of FIG. 9 where a fourth work function metal layer is deposited, as well as a sacrificial block layer, and a sacrificial cap layer, in accordance with an embodiment of the present invention.

FIG. 10 is a cross-sectional view of the semiconductor structure of FIG. 9 where a fourth work function metal layer is deposited, as well as a sacrificial block layer, and a sacrificial cap layer, in accordance with an embodiment of the present invention.

In various example embodiments, a fourth work function conducting layer 40 is deposited. The fourth work function conducting layer 40 can be, e.g., a fourth work function metal layer 40. The fourth work function metal layer 40 can be, e.g., titanium nitride (TiN). The thickness of the fourth work function metal layer 40 can be about 0.5 nm. The fourth work function metal layer 40 is deposited over each of the fins 16.

Additionally, a sacrificial block layer 42 and a sacrificial cap layer 44 are deposited. The sacrificial block layer 42 can have a thickness of about 1 nm. The sacrificial cap layer 44 can have a thickness of about 1 nm. The sacrificial block layer 42 can be amorphous Si, aluminum oxide ($Al_2O_3$). The sacrificial cap layer 44 can be, e.g., titanium nitride (TiN). In one embodiment, the layers 42 and 44 could be merged to one layer, which can be the deposited silicon oxide ($SiO_2$).

Figure 11:
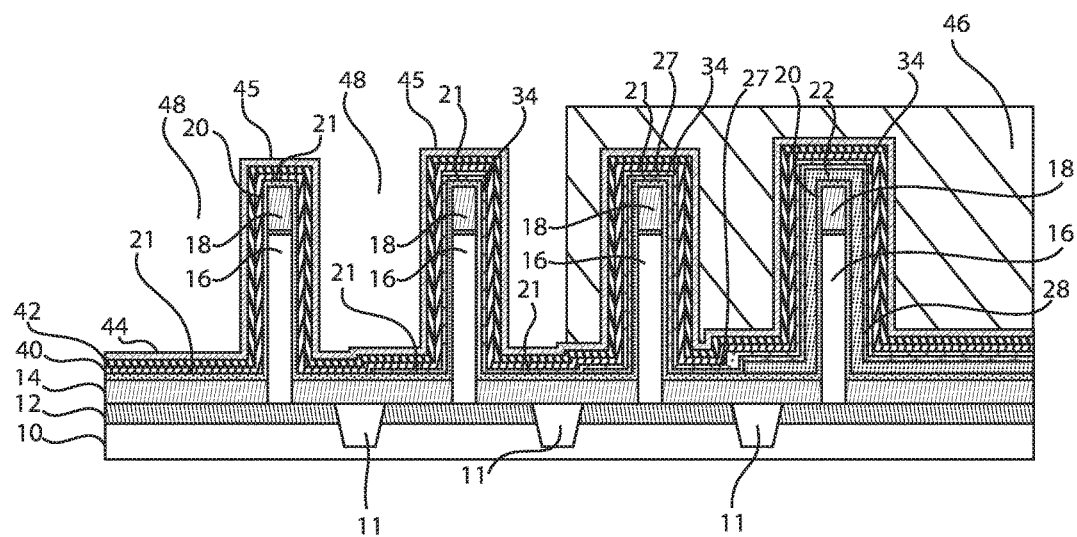
FIG. 11 is a cross-sectional view of the semiconductor structure of FIG. 10 where a patterning block layer (or stack) is deposited and recessed around the first and second FETs, in accordance with an embodiment of the present invention.

FIG. 11 is a cross-sectional view of the semiconductor structure of FIG. 10 where a patterning block layer (or stack) is deposited and recessed around the first and second FETs, in accordance with an embodiment of the present invention.

In various example embodiments, a patterning block layer (or stack) 46 is deposited over the fins 16. A portion of the oxide layer 46 is removed to create recesses 48 in an area surrounding the first and second fins 16. The removal of the portion of the oxide layer 46 results in a top surface 45 of the sacrificial cap layer 44 being exposed.

Figure 12:
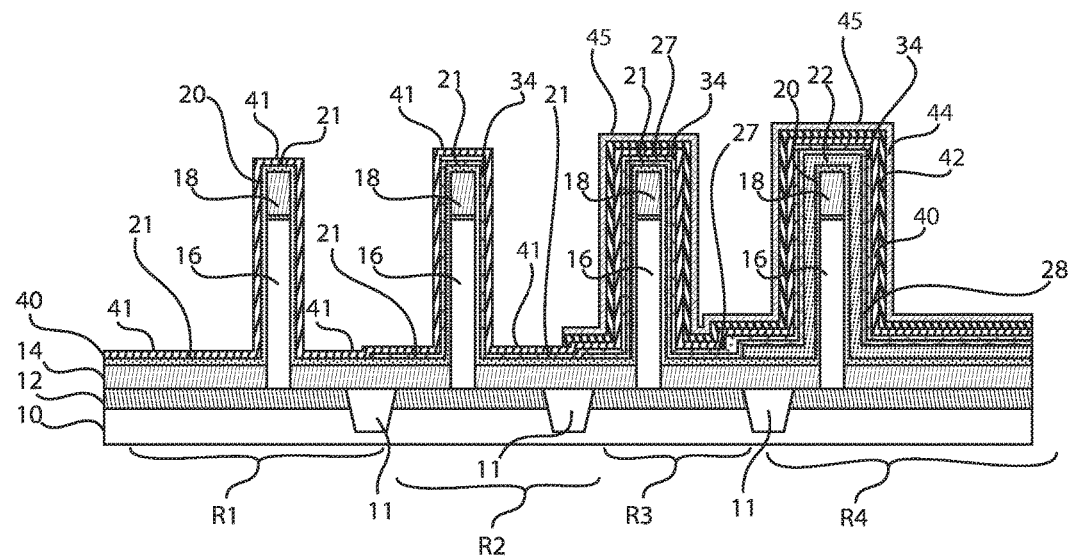
FIG. 12 is a cross-sectional view of the semiconductor structure of FIG. 11 where the sacrificial cap layer and the sacrificial block layer are removed from the first and second FETs, in accordance with an embodiment of the present invention.

FIG. 12 is a cross-sectional view of the semiconductor structure of FIG. 11 where the sacrificial cap layer and the sacrificial block layer are removed from the first and second FETs, in accordance with an embodiment of the present invention.

In various example embodiments, the sacrificial block layer 42 and a sacrificial cap layer 44 are selectively etched or removed from the first and second fins 16 (nFET SLVT and nFET RVT). Removal of the sacrificial block layer 42 and a sacrificial cap layer 44 results in a top surface 41 of the fourth work function metal layer 40 being exposed in the first and second regions R1, R2. The top surface 45 of the sacrificial cap layer 44 is exposed in the third and fourth regions R3, R4. Moreover, the first, second, third, and fourth FETs (nFET SLVT, nFET RVT, pFET RVT, and pFET SLVT) have a shared or common layer, that is, a fourth work function metal layer 40. Thus, all FETs of this structure have at least one common or shared layer, even though each FET will have a different work function (and different threshold voltage).

Figure 13:
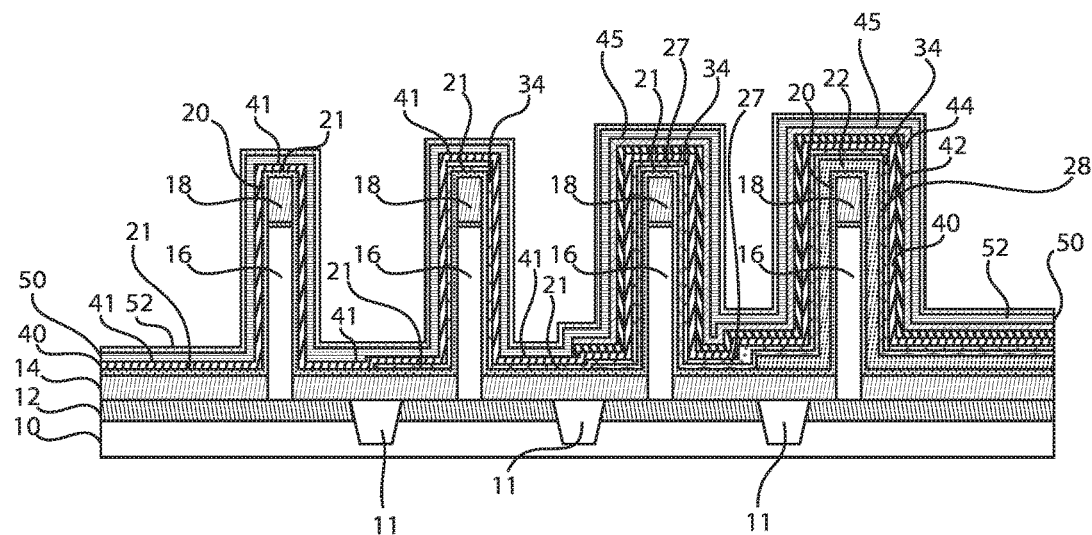
FIG. 13 is a cross-sectional view of the semiconductor structure of FIG. 12 where an nFET work function metal is deposited, as well as a patterning cap, in accordance with an embodiment of the present invention.

FIG. 13 is a cross-sectional view of the semiconductor structure of FIG. 12 where an nFET work function metal is deposited, as well as a patterning cap, in accordance with an embodiment of the present invention.

In various example embodiments, an nFET work function metal 50 and a patterning cap layer 52 are deposited. The nFET work function metal 50 can be, e.g., one of titanium (Ti), aluminum (Al), titanium aluminum (TiAl), titanium aluminum carbon (TiAlC), or any combination of Ti and Al alloys, and can be deposited by, e.g., ALD. The patterning cap layer 52 can be, e.g., a TiN layer. The nFET work function metal 50 can have a thickness of about 1 nm to about 10 nm. The patterning cap layer 52 can have a thickness of about 0.5 nm to about 4 nm.

Figure 14:
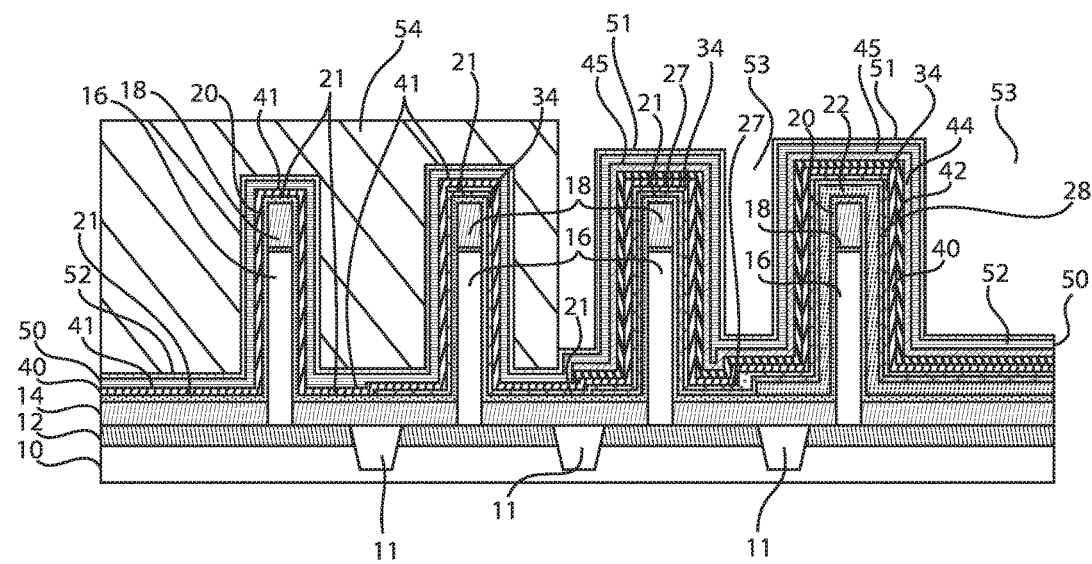
FIG. 14 is a cross-sectional view of the semiconductor structure of FIG. 13 where a patterning block layer (or stack) is deposited and recessed around the third and fourth FETs, in accordance with an embodiment of the present invention.

FIG. 14 is a cross-sectional view of the semiconductor structure of FIG. 13 where a patterning block layer (or stack) is deposited and recessed around the third and fourth FETs, in accordance with an embodiment of the present invention.

In various example embodiments, a patterning block layer (or stack) 54 is deposited over the fins 16. A portion of the oxide layer 54 is removed to create recesses 53 in an area surrounding the third and fourth fins 16. The removal of the portion of the oxide layer 54 results in a top surface 51 of the patterning cap layer 52 being exposed.

Figure 15:
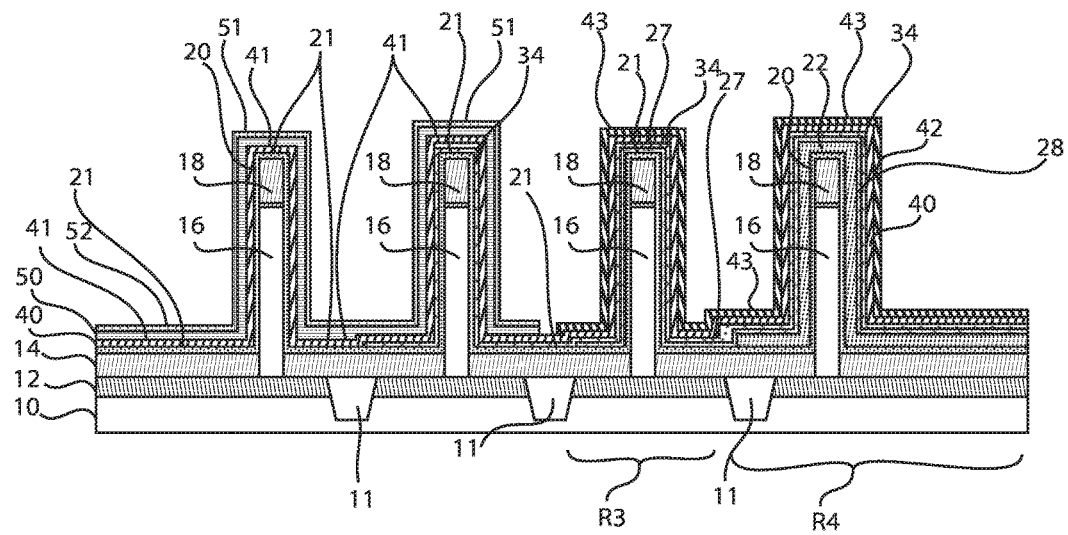
FIG. 15 is a cross-sectional view of the semiconductor structure of FIG. 14 where the nFET work function metal and the sacrificial cap layer are removed, in accordance with an embodiment of the present invention.

FIG. 15 is a cross-sectional view of the semiconductor structure of FIG. 14 where the nFET work function metal and the sacrificial cap layer are removed, in accordance with an embodiment of the present invention.

In various example embodiments, the patterning cap layer 52, the nFET work function metal 50, and the sacrificial cap layer 44 are selectively etched or removed from the third and fourth fins 16 (pFET RVT and pFET SLVT). Removal of such layers results in a top surface 43 of the sacrificial block layer 42 being exposed in the third and fourth regions R3, R4. The top surface 43 of the sacrificial block layer 42 is exposed in the third and fourth regions R3, R4. The top surface 51 of the patterning cap layer 52 is exposed in the first and second regions R1, R2. Moreover, the first and second FETs (nFET SLVT and nFET RVT) have a shared or common layer, that is, nFET work function metal 50.

Figure 16:
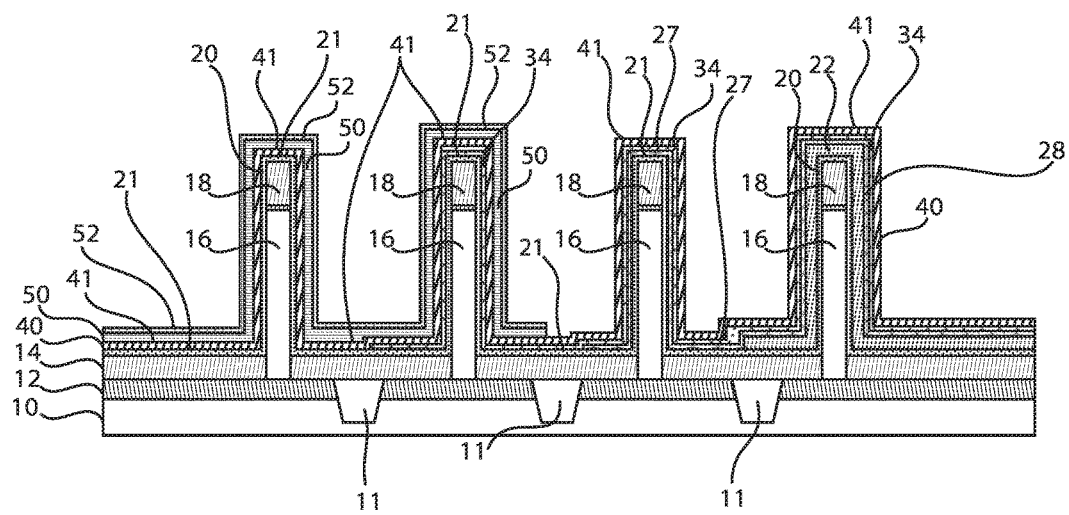
FIG. 16 is a cross-sectional view of the semiconductor structure of FIG. 15 where the sacrificial block layer is removed, in accordance with an embodiment of the present invention.

FIG. 16 is a cross-sectional view of the semiconductor structure of FIG. 15 where the sacrificial block layer is removed, in accordance with an embodiment of the present invention.

In various example embodiments, the sacrificial block layer 42 is then removed to expose a top surface 41 of the fourth work function metal layer 40 extending over the third and fourth regions R3, R4.

Figure 17:
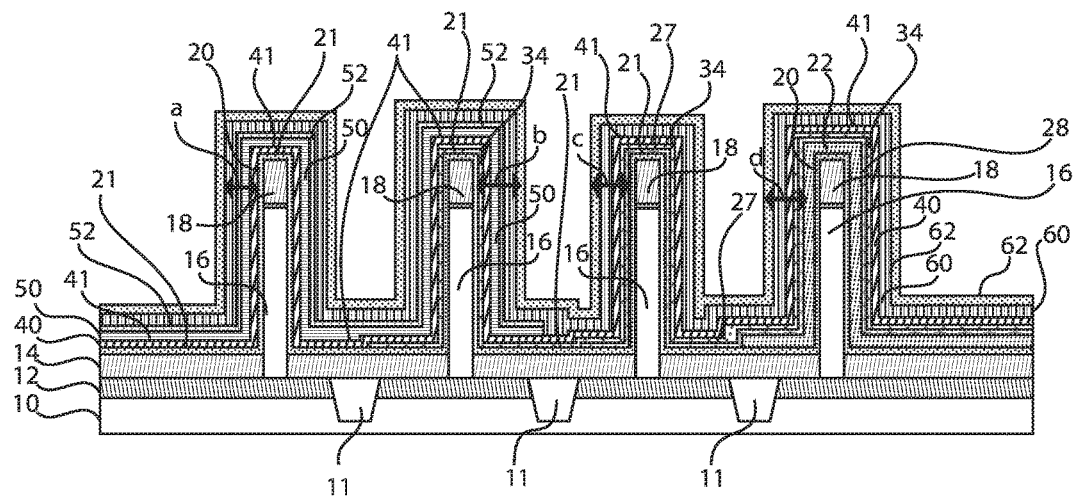
FIG. 17 is a cross-sectional view of the semiconductor structure of FIG. 16 where two additional metal layers are deposited over the first, second, third, and fourth FETs, in accordance with an embodiment of the present invention.

FIG. 17 is a cross-sectional view of the semiconductor structure of FIG. 16 where two additional metal layers are deposited over the first, second, third, and fourth FETs, in accordance with an embodiment of the present invention.

In various example embodiments, a first conducting layer 60 and a second conducting layer 62 are deposited. The first and second conducting layers 60, 62 can be, e.g., metal layers. The first conducting layer 60 can be one of titanium (Ti), aluminum (Al), titanium aluminum (TiAl), titanium aluminum carbon (TiAlC), or any combination of Ti and Al alloys, whereas the second conducting layer 62 can be, e.g., TiN. The additional metal layers 60, 62 can help tune the pFET RVT (e.g., the third fin in the third region R3). The difference b-a is about 0.5 nm to about 1 nm. The difference d-c is about 1.5 nm to about 2 nm. The difference b-d is about 0 nm and the difference a-c is about 0 nm. Therefore, the thickness difference between the gate stacks is less than about 2 nm.

Moreover, the first, second, third, and fourth FETs (nFET SLVT, nFET RVT, pFET RVT, and pFET SLVT) have two shared or common layers, that is, metal layers 60, 62. Additionally, the fourth work function metal layer 40 is shared or common for all four FETs. The first work function metal layer 40 is not shared by all the FETs. In fact, the first work function metal layer 40 is formed only for the pFET SLVT (far right). The second work function metal layer 28 is not shared by all the FETs. In fact, the second work function metal layer 28 is shared only with the third and fourth FETs (pFET RVT, and pFET SLVT). The third work function metal layer 34 is not shared by all the FETs. In fact, the third work function metal layer 34 is shared only with the second, third, and fourth FETs (nFET RVT, pFET RVT, and pFET SLVT). Therefore, some FETs have shared or common layers, whereas others do not. The fourth work metal function 40, e.g., is shared by all four FETs, even though all the FETs have different work functions (and different threshold voltages).

Figure 18:
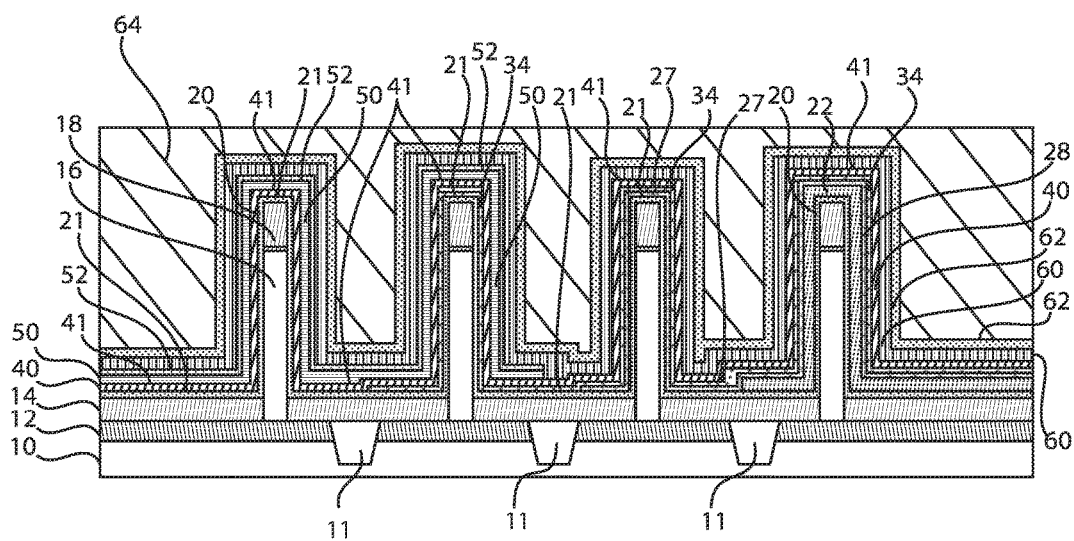
FIG. 18 is a cross-sectional view of the semiconductor structure of FIG. 17 where a dummy fill material is deposited, in accordance with an embodiment of the present invention.

FIG. 18 is a cross-sectional view of the semiconductor structure of FIG. 17 where an organic planarization layer (OPL) is deposited, in accordance with an embodiment of the present invention.

In various example embodiments, an organic planarization layer (OPL) 64 is deposited over the fins 16. The OPL 64 can be formed utilizing a deposition process such as, for example, spin-on, CVD, PECVD, evaporation, chemical solution deposition and other like deposition techniques. The thickness of the OPL 64 can vary so long as its thickness is greater than the total thickness of each gate line and of the plurality of gate lines (not shown). In one embodiment, the OPL 64 has a thickness from 50 nm to 500 nm. In another embodiment, the OPL 64 has a thickness from 150 nm to 300 nm.

Figure 19:
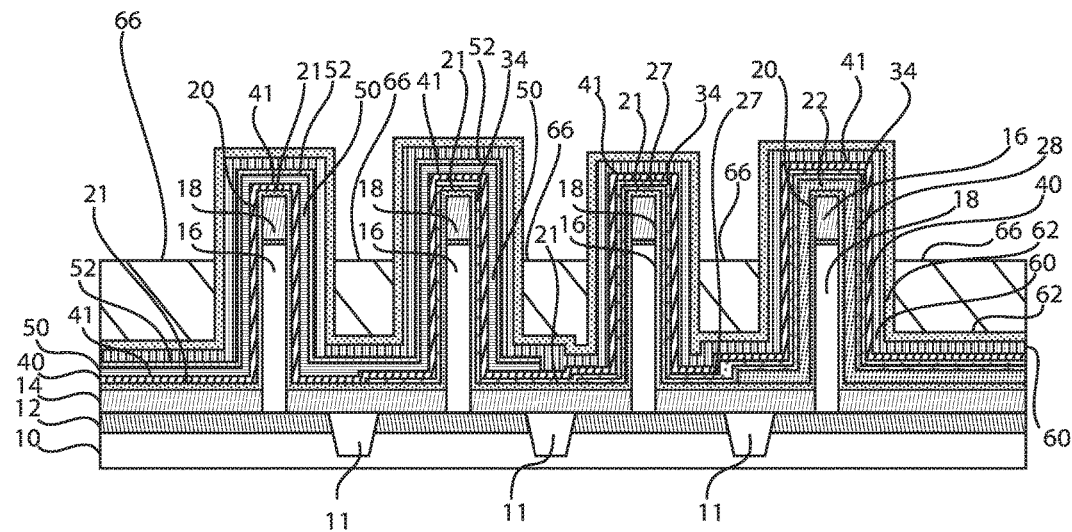
FIG. 19 is a cross-sectional view of the semiconductor structure of FIG. 18 where the dummy fill material is recessed, in accordance with an embodiment of the present invention.

FIG. 19 is a cross-sectional view of the semiconductor structure of FIG. 18 where the OPL is recessed, in accordance with an embodiment of the present invention.

In various example embodiments, the OPL 64 is recessed below a bottom surface of the hard mark 18. The OPL 64 is recessed to a level just below a top surface/portion of the fins 16. The recessed OPL 66 sits between the fins 16 or between the nFETs and pFETs.

Figure 20:
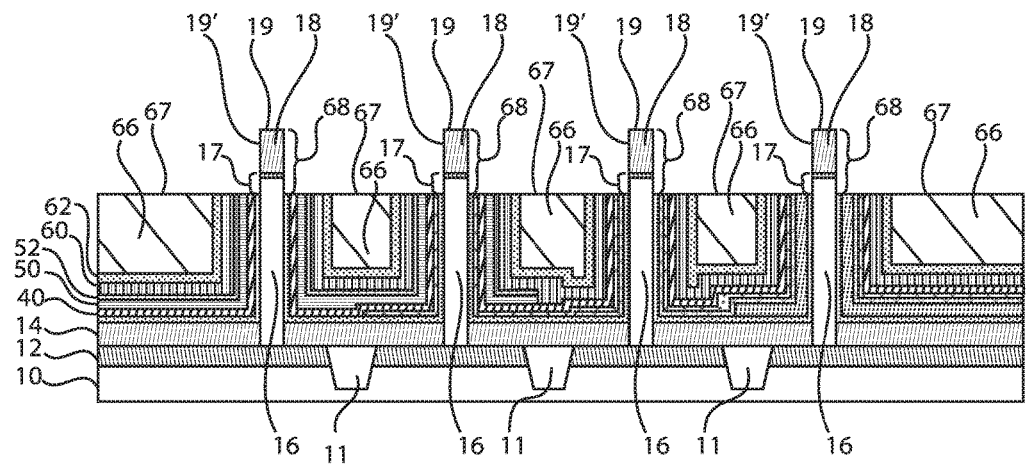
FIG. 20 is a cross-sectional view of the semiconductor structure of FIG. 19 where the remaining work function metals of the first, second, third, and fourth FETs are removed, in accordance with an embodiment of the present invention.

FIG. 20 is a cross-sectional view of the semiconductor structure of FIG. 19 where the remaining work function metals of the first, second, third, and fourth FETs are removed, in accordance with an embodiment of the present invention.

In various example embodiments, the work function metal layers of each of the FETs are recessed. Additionally, the high k dielectric oxide layer 20 is recessed to expose the hard mask 18, as well as a top portion 17 of each fin 16. The top surface 19 and the side surfaces 19' of the hard mask 18 are exposed. The top section of the fins 16 and hard mask 18 exposed is designated as section 68. Moreover, the recess results in the exposure of the top surface 67 of the recessed OPL 66.

Figure 21:
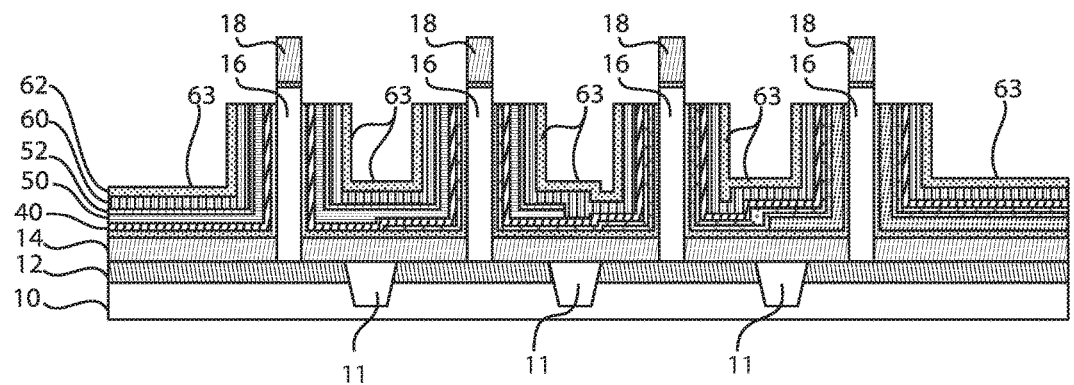
FIG. 21 is a cross-sectional view of the semiconductor structure of FIG. 20 where the OPL is stripped, in accordance with an embodiment of the present invention.

FIG. 21 is a cross-sectional view of the semiconductor structure of FIG. 20 where the OPL is stripped, in accordance with an embodiment of the present invention.

In various example embodiments, the recessed OPL 66 is removed to expose an inner surface 63 of the metal layer 62.

Figure 22:
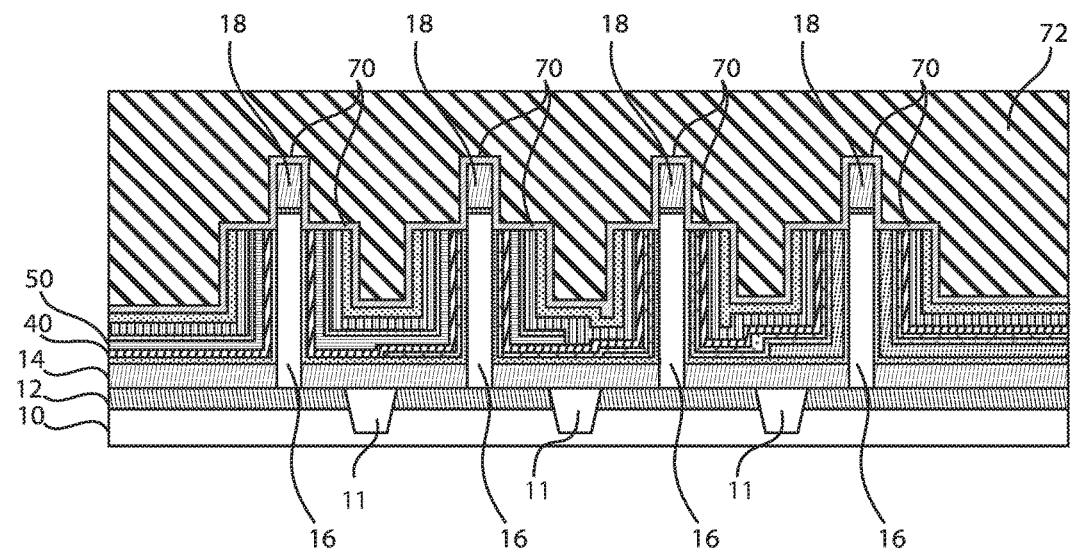
FIG. 22 is a cross-sectional view of the semiconductor structure of FIG. 21 where an oxide layer is deposited, in accordance with an embodiment of the present invention.

FIG. 22 is a cross-sectional view of the semiconductor structure of FIG. 21 where an oxide layer is deposited, in accordance with an embodiment of the present invention.

In various example embodiments, an encapsulation layer 70 is deposited over the fins 16, as well as within the inner surfaces 63 of the metal layer 62. An oxide layer 72 is then deposited thereon. The oxide layer 72 can be an interlevel dielectric (ILD).

In various embodiments, the height of the ILD oxide fill 72 can be reduced by chemical-mechanical polishing (CMP) and/or etching. Therefore, the planarization process can be provided by CMP. Other planarization process can include grinding and polishing.

In one or more embodiments, the ILD oxide 72 can have a thickness in the range of about 10 nm to about 100 nm, or in the range of about 10 nm to about 30 nm.

The ILD 72 can be selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamondlike carbon (DLC), also known as amorphous hydrogenated carbon, α-C:H). Additional choices for the ILD 72 include any of the aforementioned materials in porous form, or in a form that changes during processing to or from being porous and/or permeable to being non-porous and/or non-permeable.

Figure 23:
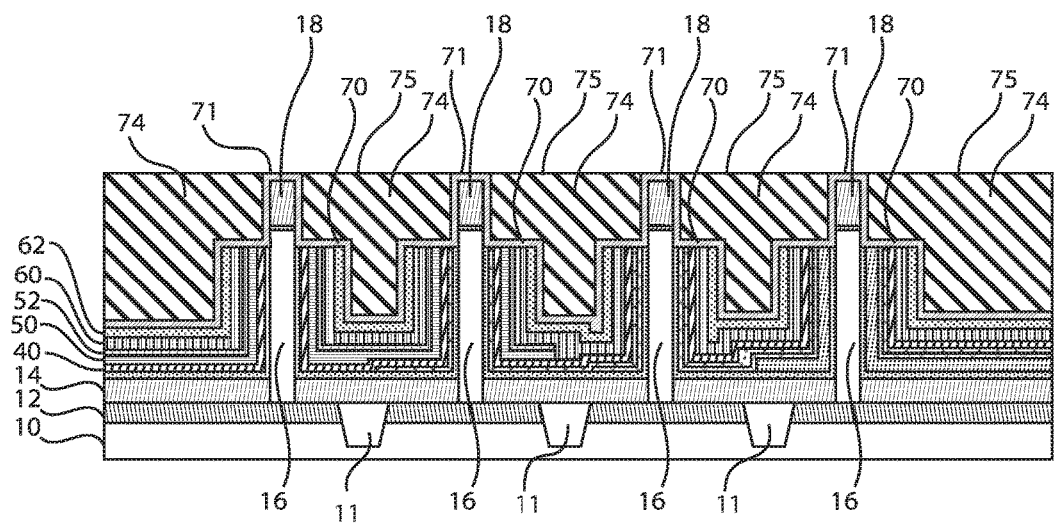
FIG. 23 is a cross-sectional view of the semiconductor structure of FIG. 22 where the oxide layer is recessed to a top surface of the hard mask after CMP, in accordance with an embodiment of the present invention.

FIG. 23 is a cross-sectional view of the semiconductor structure of FIG. 22 where the oxide layer is recessed to a top surface of the hard mask, in accordance with an embodiment of the present invention.

In various example embodiments, the ILD oxide 72 can be planarized by CMP, as discussed above. The remaining ILD oxide is designated as 74. The ILD oxide 72 is planarized such that a top surface 71 of the encapsulation layer 70 is exposed. Thus, a top surface 75 of the remaining ILD oxide 74 is flush with the top surface 71 of the encapsulation layer 70.

Figure 24:
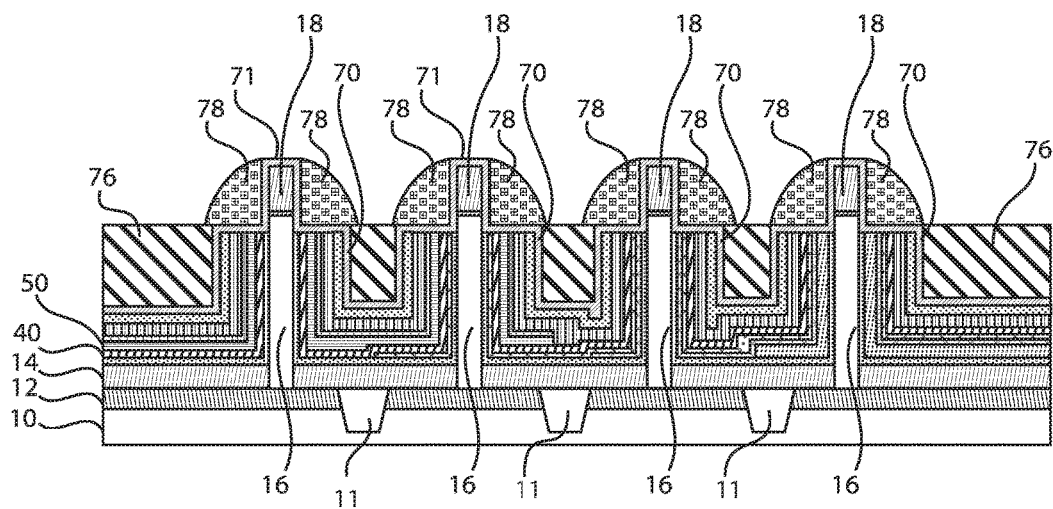
FIG. 24 is a cross-sectional view of the semiconductor structure of FIG. 23 where the oxide layer is further recessed and spacers are formed adjacent the hard masks of each of the first, second, third, and fourth FETs, in accordance with an embodiment of the present invention.

FIG. 24 is a cross-sectional view of the semiconductor structure of FIG. 23 where the oxide layer is further recessed and spacers are formed adjacent the hard masks of each of the first, second, third, and fourth FETs, in accordance with an embodiment of the present invention.

In various example embodiments, the ILD oxide 74 is further recessed to a level that extends up to a top surface of the remaining work function metal layers. Stated differently, the recessed ILD oxide 76 extends just below a top surface of the fins 16. Additionally, spacers 78 are formed adjacent the top section 68 of the fins 16. The spacers extend to the top surface 71 of the encapsulation layer 70. The spacers 78 are formed adjacent the hard masks 18. The spacers 78 contact the encapsulation layer 70.

The spacers 78 can be, e.g., a nitride film. In an embodiment, the spacers 78 can be an oxide, for example, silicon oxide (SiO), a nitride, for example, a silicon nitride (SiN), or an oxynitride, for example, silicon oxynitride (SiON). In an embodiment, the spacers 78 can be, e.g., SiOCN, SiBCN, or similar film types. The spacers 78 can also be referred to as a non-conducting dielectric layer.

In some exemplary embodiments, the spacers 78 can include a material that is resistant to some etching processes such as, for example, HF (hydrogen fluoride) chemical etching or chemical oxide removal etching. For illustrative purposes, the spacers 78 are shown as a single layer of material. Exemplary embodiments of the spacers 78 can include, for example, multiple layers of similar or dissimilar materials that can be disposed in horizontally or vertically arranged layers relative to the substrate 10 by any suitable material deposition process.

In one or more embodiments, the spacers 78 can have a thickness in the range of about 3 nm to about 20 nm, or in the range of about 3 nm to about 10 nm.

Figure 25:
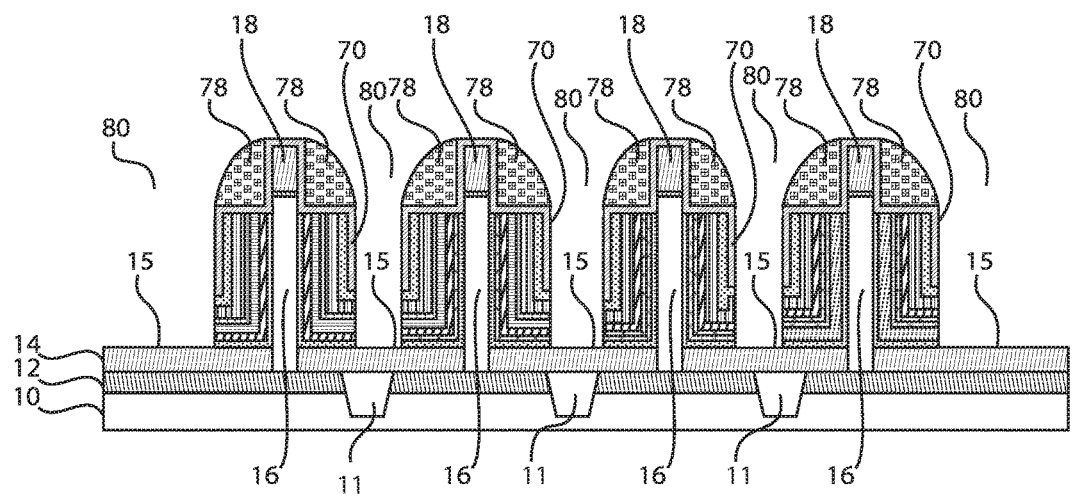
FIG. 25 is a cross-sectional view of the semiconductor structure of FIG. 24 where isolation patterning is performed between the FETs, in accordance with an embodiment of the present invention.

FIG. 25 is a cross-sectional view of the semiconductor structure of FIG. 24 where isolation patterning is performed between the FETs, in accordance with an embodiment of the present invention.

In various example embodiments, the FETs are isolated by an isolation patterning technique, such as RIE. The etching results in the exposure of a top surface 15 of the isolation dielectric layer. Thus, the fins 16 (or FETs) are separated by recesses 80 by self-alignment.

Figure 26:
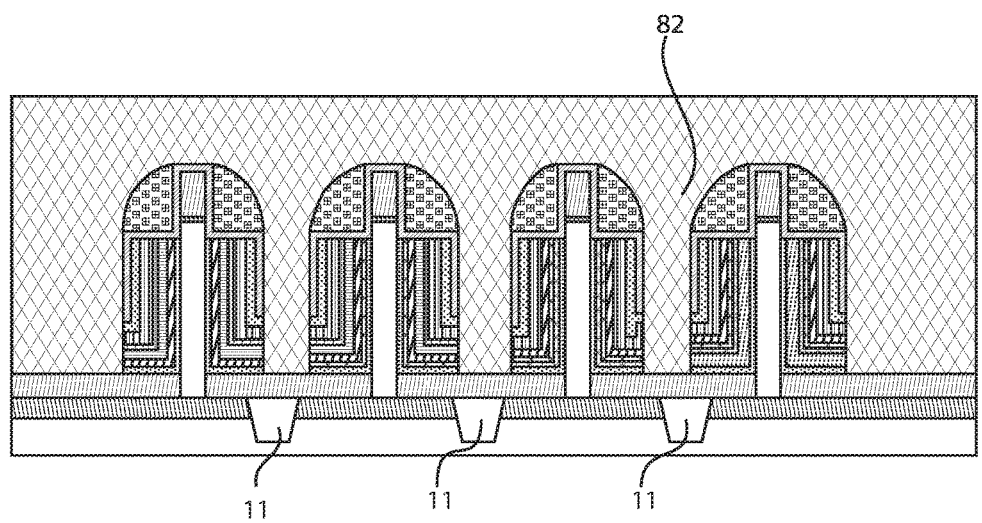
FIG. 26 is a cross-sectional view of the semiconductor structure of FIG. 25 where an insulator is deposited, in accordance with an embodiment of the present invention.

FIG. 26 is a cross-sectional view of the semiconductor structure of FIG. 25 where an insulator is deposited, in accordance with an embodiment of the present invention.

In various example embodiments, an insulator 82 is deposited over the FETs such that the recesses 80 are filled with the insulator 82. Additionally, the insulator 82 covers the entirety of the spacers 78.

Figure 27:
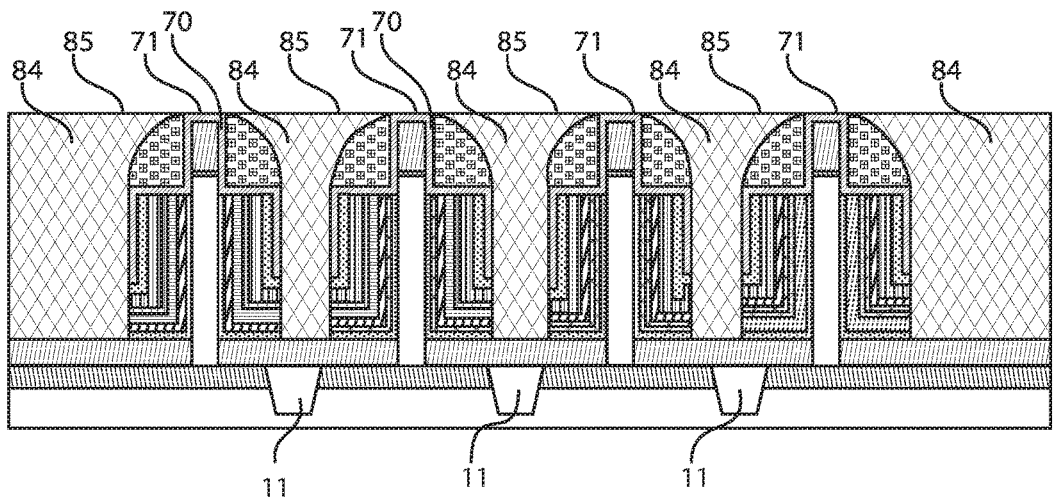
FIG. 27 is a cross-sectional view of the semiconductor structure of FIG. 26 where the insulator is recessed up to a top surface of the hard mask, in accordance with an embodiment of the present invention.

FIG. 27 is a cross-sectional view of the semiconductor structure of FIG. 26 where the insulator is recessed up to a top surface of the hard mask, in accordance with an embodiment of the present invention.

In various example embodiments, the insulator 82 is planarized by, e.g., CMP. The planarization results in the top surface 71 of the encapsulation layer 70 being exposed. The top surface 85 of the recessed insulator 84 is flush with the top surface 71 of the encapsulation layer 70.

Figure 28:
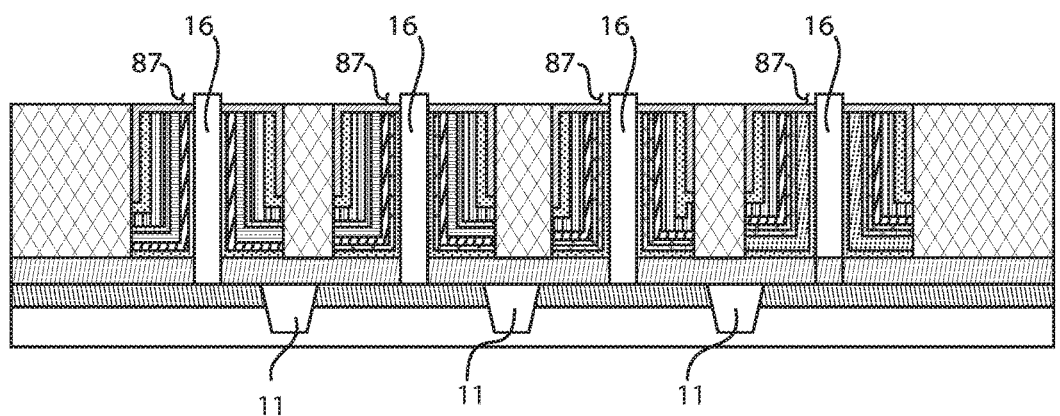
FIG. 28 is a cross-sectional view of the semiconductor structure of FIG. 27 where etching is performed to expose a channel of each of the first, second, third, and fourth FETs, in accordance with an embodiment of the present invention.

FIG. 28 is a cross-sectional view of the semiconductor structure of FIG. 27 where etching is performed to expose a channel of each of the first, second, third, and fourth FETs, in accordance with an embodiment of the present invention.

In various example embodiments, a non-selective RIE is performed to expose a top section 87 of the fins 16 of each of the FETs. Thus, the channel material of each of the FETs is exposed.

Figure 29:
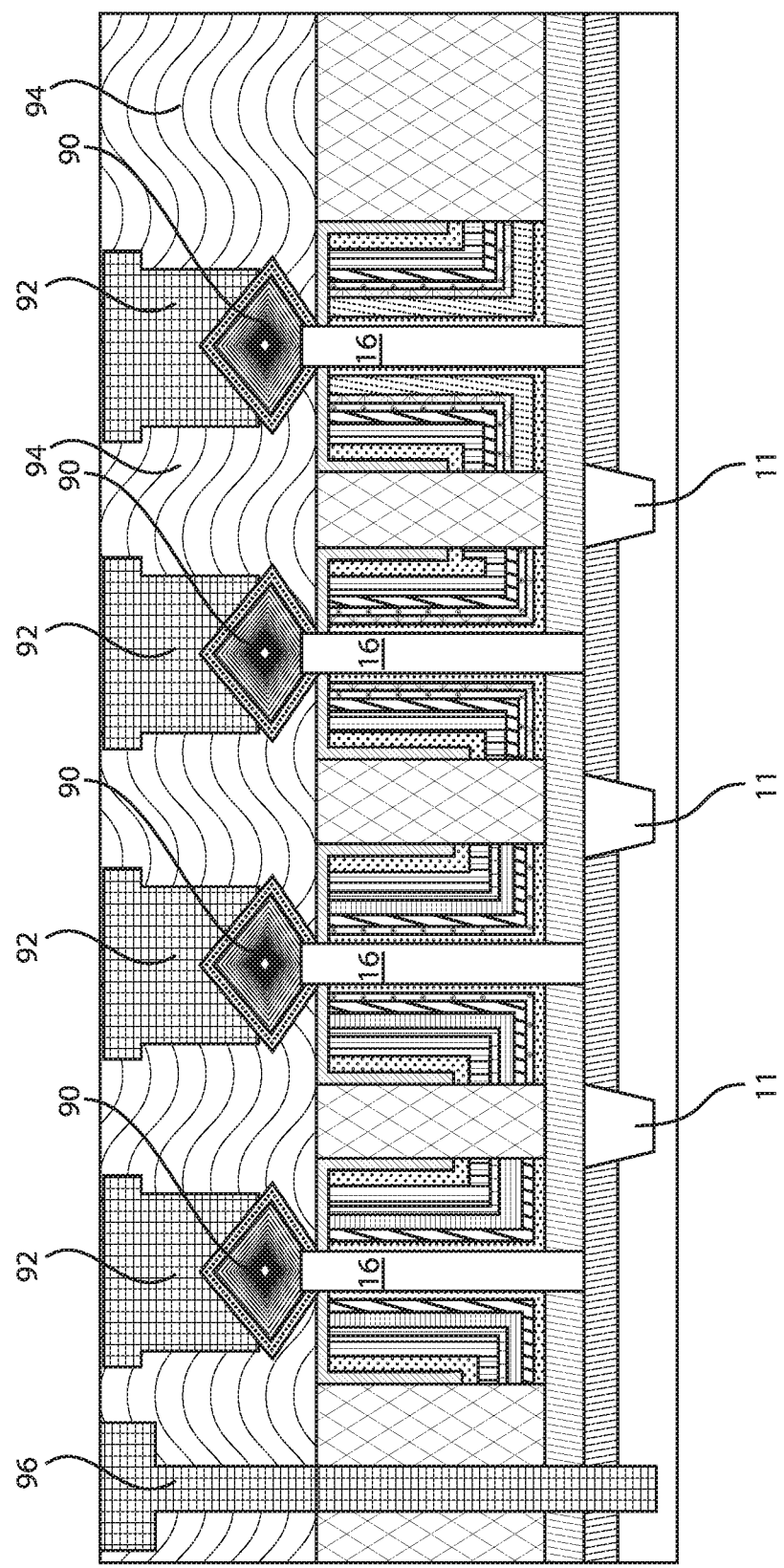
FIG. 29 is a cross-sectional view of the semiconductor structure of FIG. 28 where source/drain regions and contacts are formed, in accordance with an embodiment of the present invention.

FIG. 29 is a cross-sectional view of the semiconductor structure of FIG. 28 where source/drain regions and contacts are formed, in accordance with an embodiment of the present invention.

In various example embodiments, top source/drain regions 90 are formed over each of the channels or FETs or fins 16. Contacts 92 and 96 can then be formed. The contacts 92 are formed over the top source/drain regions 90, whereas the contact 96 extends to the substrate 10. An insulator 94 can also be deposited between the contacts 92. The insulator 94 can be planarized by, e.g., CMP to be flush with a top surface of the contacts 92, 96. As a result, the pFET RVT and the nFET RVT can have a shared/common gate structure. Similarly, the pFET SLVT and the nFET SLVT can have a shared/common gate structure. Moreover, a pure multi-Vt scheme can be combined with a dipole multi-Vt scheme to provide for more Vt options without channel doping.

By similar reason, this pure work function metal scheme can also be used in a replacement metal gate to set up the multi-Vt scheme.

Consequently, the structure of FIG. 29 allows for the work function of selected transistors to be fine-tuned. This results in a final structure having four different work functions. As a result, multiple work functions can be achieved for different devices on the same wafer/chip. The work function difference is provided by selectively applying different work function metals in between a variety of patterning steps throughout the manufacturing process. As a result, the gate stack of each FET can have a different work function to achieve complementary metal oxide semiconductor (CMOS) technology with multiple threshold voltages (Vt) on fully depleted channel architectures in order to take advantage of higher mobility and smaller device variability. Thus, multiple voltage thresholds by pure metal gates can offer better performance and better mismatch because of mobility enhancement due to less doping or no doping in the channel. The multi-layer gate stacks can thus define the voltage thresholds.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method of device fabrication and a semiconductor device thereby fabricated for achieving multi-layer work function metal gates with similar gate thickness to further achieve different threshold voltages for each field effect transistor (FET) (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A structure for forming a device having multiple field effect transistors (FETs) with each FET having a different work function, the structure comprising:

first, second, third, and fourth FETs formed over a semiconductor substrate;

an interfacial layer and a high-k dielectric layer formed over the first, second, third, and fourth FETs;

a first work function conducting layer formed over the high-k dielectric layer, where the first work function conducting layer is subsequently removed from the third FET;

a second work function conducting layer disposed in direct contact with portions of the first work function conducting layer, where the second work function conducting layer is subsequently removed from the second FET;

a third work function conducting layer disposed in direct contact with portions of the second work function conducting layer, where the third work function conducting layer is subsequently removed from the first FET;

a fourth work function conducting layer disposed in direct contact with portions of the third work function conducting layer;

a fifth work function conducting layer, where the fifth work function conducting layer is subsequently removed from the third and fourth FETs; and first and second conducting layers formed over the first, second, third, and fourth FETs.

2. The structure of claim 1, wherein an organic planarization layer (OPL) is deposited and subsequently recessed.

3. The structure of claim 2, wherein the remaining work function conducting layers from the first, second, third, and fourth FETs are recessed to expose a hard mask of each of the first, second, third, and fourth FETs.

4. The structure of claim 3, wherein the OPL is stripped.

5. The structure of claim 4, wherein a dielectric layer is deposited up to a top surface of the hard mask of each of the first, second, third, and fourth FETs.

6. The structure of claim 5, wherein the dielectric layer is recessed and spacers are formed.

7. The structure of claim 6, wherein isolation patterning of the first, second, third, and fourth FETs is performed.

8. The structure of claim 7, wherein an insulator is deposited between the recesses formed by the isolation patterning.

9. The structure of claim 8, wherein a top portion of a channel of each of the first, second, third, and fourth FETs is exposed by etching.

10. The structure of claim 9, wherein source and/or drain regions and contacts are formed over the channel of each of the first, second, third, and fourth FETs.

11. A structure for forming a device having a plurality of field effect transistors (FETs) with each FET having a different work function, the structure comprising:

at least one dielectric layer formed over the plurality of FETs;

a first work function conducting layer formed over the at least one dielectric layer, where the first work function conducting layer is subsequently removed from a first FET;

a second work function conducting layer disposed in direct contact with portions of the first work function conducting layer, where the second work function conducting layer is subsequently removed from a second FET;

a third work function conducting layer disposed in direct contact with portions of the second work function conducting layer, where the third work function conducting layer is subsequently removed from a third FET;

a fourth work function conducting layer disposed in direct contact with portions of the third work function conducting layer;

a fifth work function conducting layer, where the fifth work function conducting layer is subsequently removed from at least the first FET; and at least one conducting layer formed over the plurality of FETs;

wherein multi-layer work function metal gates of each of the plurality of FETs have a similar gate thickness.

12. The structure of claim 11, wherein an organic planarization layer (OPL) is deposited and subsequently recessed.

13. The structure of claim 12, wherein the remaining work function conducting layers from the plurality of FETs are recessed to expose a hard mask of each of the plurality of FETs.

14. The structure of claim 13, wherein the OPL is stripped.

15. The structure of claim 14, wherein a dielectric layer is deposited up to a top surface of the hard mask of each of the plurality of FETs.

16. The structure of claim 15, wherein the dielectric layer is recessed and spacers are formed.

17. The structure of claim 16, wherein isolation patterning of the plurality of FETs is performed.

18. The structure of claim 17, wherein an insulator is deposited between the recesses formed by the isolation patterning.

19. The structure of claim 18, wherein a top portion of a channel of each of the plurality of FETs is exposed by etching.

20. The structure of claim 19, wherein source and/or drain regions and contacts are formed over the channel of each of the plurality of FETs.

* * * * *